(12) United States Patent
Teboulle et al.

(10) Patent No.: US 11,095,077 B2
(45) Date of Patent: Aug. 17, 2021

(54) ELECTRICAL EQUIPMENT COMPRISING AN LED FOR DETECTING A CONNECTOR

(71) Applicant: SAGEMCOM ENERGY & TELECOM SAS, Rueil Malmaison (FR)

(72) Inventors: Henri Teboulle, Rueil Malmaison (FR); Rami Khouri, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 0 days.

(21) Appl. No.: 16/965,413

(22) PCT Filed: Feb. 22, 2019

(86) PCT No.: PCT/EP2019/054426
§ 371 (c)(1),
(2) Date: Jul. 28, 2020

(87) PCT Pub. No.: WO2019/162432
PCT Pub. Date: Aug. 29, 2019

(65) Prior Publication Data
US 2021/0036470 A1 Feb. 4, 2021

(30) Foreign Application Priority Data
Feb. 22, 2018 (FR) .................................... 18 51513

(51) Int. Cl.
*G08B 23/00* (2006.01)
*H01R 13/717* (2006.01)
(Continued)

(52) U.S. Cl.
CPC ......... *H01R 13/7175* (2013.01); *H01R 13/70* (2013.01); *H01R 24/52* (2013.01); *H01R 2201/02* (2013.01)

(58) Field of Classification Search
CPC ................................ G01D 4/004; H04Q 9/00
(Continued)

(56) References Cited

U.S. PATENT DOCUMENTS 5,222,164 A 6/1993 Bass, Sr. et al.
5,621,256 A 4/1997 Crane et al.
(Continued)

*Primary Examiner* — Phuong Chi Thi Nguyen
(74) *Attorney, Agent, or Firm* — Muncy, Geissler, Olds & Lowe, P.C.

(57) ABSTRACT

Electrical equipment comprising a first portion and a second portion that is electrically insulated from the first portion, the first portion comprising a frontal component, a diode, a photodiode and a processing module, the second portion comprising a first connector connected to the frontal component while being electrically insulated therefrom, a receiving space being arranged to receive a second connector that is able to be connected to the first connector, the processing module being arranged to deliver a supply current to the light-emitting diode so that the latter produces an emitted light signal, in order to acquire a detection electrical signal produced by the photodiode representative of a light signal received by the photodiode, and in order to detect a presence or absence of the second connector in the receiving space depending on the detection electrical signal.

14 Claims, 2 Drawing Sheets

(51) Int. Cl.
*H01R 13/70* (2006.01)
*H01R 24/52* (2011.01)

(58) Field of Classification Search
USPC .......... 340/870.02, 870.01, 870.03; 439/277
See application file for complete search history.

(56) References Cited

U.S. PATENT DOCUMENTS

| | | | |
|---|---|---|---|
| 6,177,883 B1* | 1/2001 | Jennetti | G08C 17/02 |
| | | | 340/870.02 |
| 8,317,151 B1* | 11/2012 | Koehler | H01Q 1/1214 |
| | | | 248/534 |
| 8,378,847 B2* | 2/2013 | Bartram | G01F 15/18 |
| | | | 340/870.02 |
| 2003/0002808 A1 | 1/2003 | Lampert et al. | |
| 2009/0047841 A1 | 2/2009 | Morey et al. | |
| 2009/0286427 A1 | 11/2009 | Bolin et al. | |
| 2011/0230073 A1 | 9/2011 | Ford et al. | |
| 2015/0276454 A1 | 10/2015 | Laursen et al. | |

\* cited by examiner

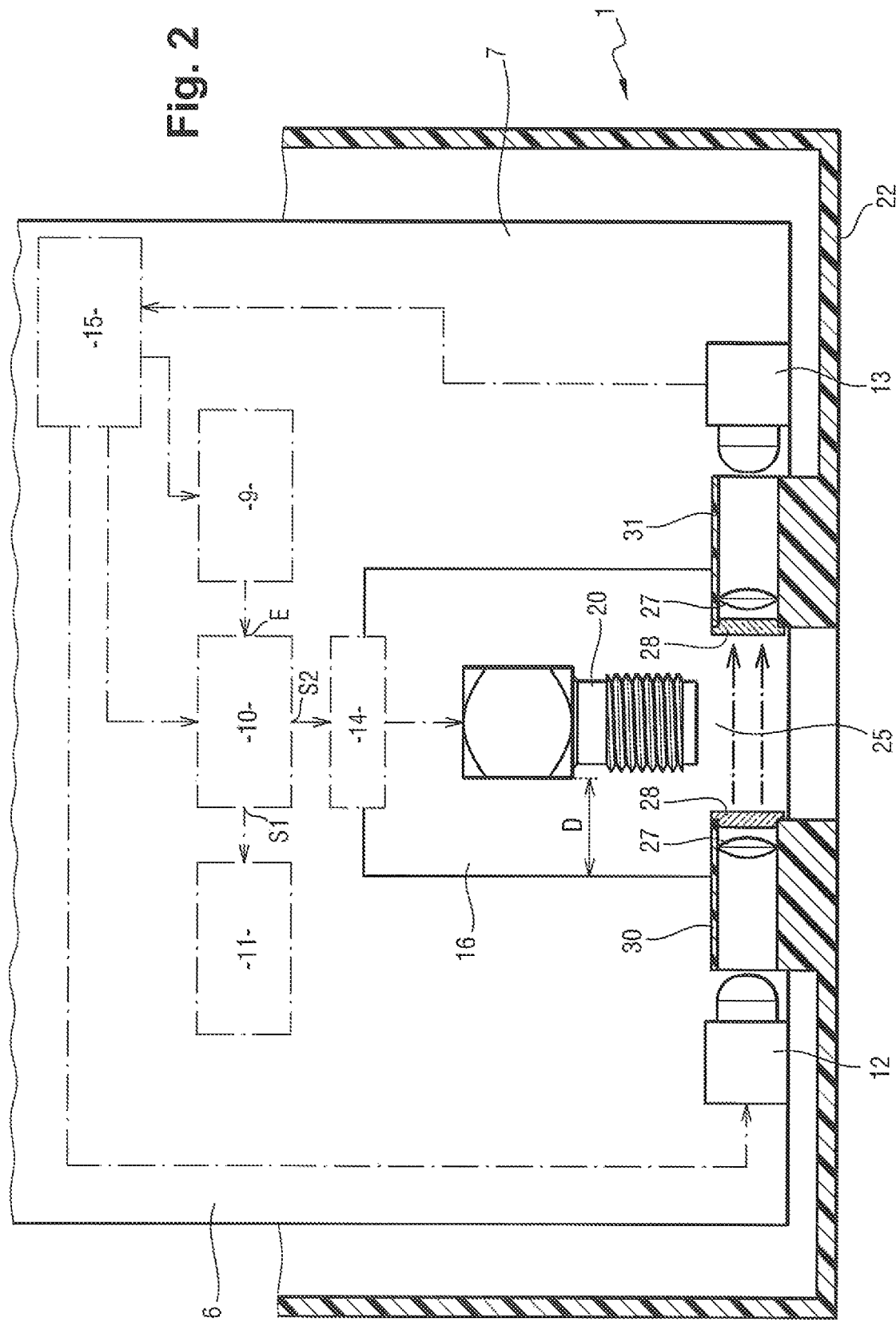

ELECTRICAL EQUIPMENT COMPRISING AN LED FOR DETECTING A CONNECTOR

BACKGROUND OF THE INVENTION

The invention relates to the field of electrical equipment comprising a first portion and a second portion that is electrically isolated from the first portion.

Certain modern meters, e.g. electricity, water, or gas meters, are provided with a radiofrequency (RF) communication module. By means of the RF communication module, a meter can communicate, either directly or else via a data concentrator, with a supplier of electricity, water, or gas, or indeed with a network manager or distributor.

By way of example, the data transmitted or received by such a meter may comprise data relating to the consumption of electricity, water, or gas, to a pricing policy, to a subscription, to monitoring the meter, to ordering opening or closing of a cut-off member of the meter if it is an electricity meter, etc.

The RF communication module of such a meter is then connected to an internal antenna situated inside a housing of the meter. Sometimes, and in particular when the meter is located in a geographical region that is isolated or remote from the nearest data concentrator, RF communication is difficult, and it is advantageous to connect an external antenna to the meter in order to improve data transmission and reception.

Using an external antenna does not pose any problems when the voltages inside the meter are relatively low. Such a voltage is sometimes referred to as a "safety extra low voltage" (SELV).

Nevertheless, the situation is more problematic when the voltages inside the meter can be high. Such a voltage is sometimes referred to as telecommunication network voltage (TNV).

Specifically, under such circumstances, in order to enable the meter to comply with the usual electrical standards, it is appropriate to ensure that the external antenna and the cable connecting it to the meter are electrically isolated from the inside of the meter. This requirement for electrical isolation makes it more complicated to design the electrical interface between the external antenna and the meter, and also makes it more complicated to design the switching function between the internal antenna and the external antenna.

OBJECT OF THE INVENTION

An object of the invention is to solve the above-described problem.

SUMMARY OF THE INVENTION

In order to achieve this object, there is provided electrical equipment comprising a first portion and a second portion electrically isolated from the first portion, the first portion comprising a front-end component, a light-emitting diode (LED), a photodiode, and a processor module, the second portion comprising a first connector connected to the front-end component while being electrically isolated therefrom, a reception space extending facing the first connector and being arranged to receive a second connector suitable for connecting to the first connector, the LED and the photodiode being arranged on either side of the reception space, the processor module being arranged to supply power to the LED so that it emits a light signal in order to acquire an electrical detection signal that is produced by the photodiode and that is representative of a light signal received by the photodiode, and in order to detect the second connector being present in or absent from the reception space as a function of the electrical detection signal.

It is possible that high voltages might be present in the first portion of the electrical equipment. When an operator or a user connects an external antenna to the electrical equipment, said external antenna being linked via a cable to the second connector, the operator or the user connects the second connector to the first connector of the second portion of the electrical equipment, which second portion is electrically isolated from the first portion.

Thus, the high voltages cannot be present in the second portion, and the operator or the user can handle the external antenna and the cable without risk.

The LED and the photodiode make it possible for the second connector to be detected as being present when the light signal is interrupted by the connector or by its cable, and thus, in the above context, they make it possible to detect that the external antenna is connected to the electrical equipment. This detection makes it possible to manage effectively potential switching between an internal antenna of the electrical equipment and the external antenna. The LED and the photodiode, which might be subjected to high voltages, are both isolated from the second portion. Detection is thus performed without risk for the operator or the user handling the external antenna of the cable.

There is also provided electrical equipment as described above, further comprising an internal antenna, an RF communication module, and a switch component situated in the first portion, the switch component having an input connected to the RF communication module, a first output connected to the internal antenna, and a second output connected to the first connector, the processor module being arranged to connect the input to the first output when the second connector is detected as being absent from the reception space, and to connect the input to the second output when the second connector is detected as being present in the reception space.

There is also provided a configuration method performed in electrical equipment as described above, the configuration method comprising the steps of:

emitting the light signal;

acquiring the electrical detection signal;

if the second connector is detected as being absent, connecting the input of the switch component to the first output of the switch component;

if the second connector is detected as being present, connecting the input of the switch component to the second output of the switch component.

There is also provided a computer program comprising instructions for enabling a microcontroller of electrical equipment to perform the configuration method as described above.

There are also provided storage means, characterized in that they store a computer program comprising instructions for enabling a microcontroller of electrical equipment to perform the configuration method as described above.

Other characteristics and advantages of the invention appear on reading the following description of a particular, nonlimiting embodiment of the invention.

BRIEF DESCRIPTION OF THE DRAWINGS

Reference is made to the accompanying drawings, in which:

FIG. 2 is a circuit diagram of the meter.

DETAILED DESCRIPTION OF THE INVENTION

Figure 1:
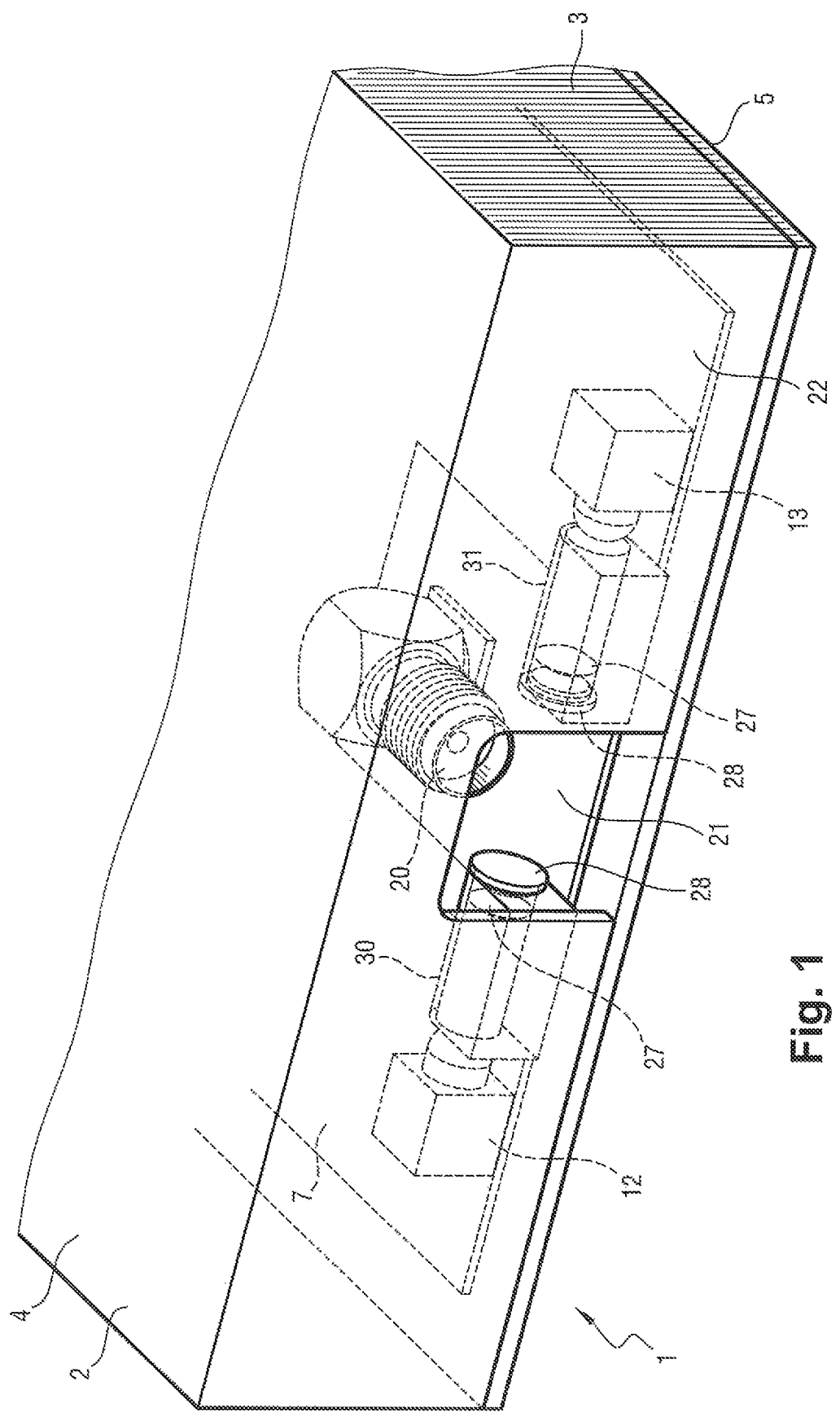
FIG. 1 is a perspective view from beneath of electrical equipment of the invention, the electrical equipment being an electricity meter.

With reference to FIGS. 1 and 2, in this example the electrical equipment of the invention is an electricity meter 1.

The meter 1 includes a housing 2 comprising a box 3, a lid 4, and a terminal-cover (not shown in FIG. 1). A rear face 5 of the box 3 is for fastening to a wall of a dwelling or of any building. When the meter 1 is in operation, the lid 4 is sealed to the box 3 and the terminal-cover is sealed to the lid 4. In this example, the lid is sealed to the box by heat staking. Thus, while the meter 1 is in operation, any access to the inside of the meter 1 by a non-authorized person can be detected and can be sanctioned.

The meter 1 comprises a first portion and a second portion that is electrically isolated from the first portion.

The first portion of the meter 1 occupies a first fraction 6 of a circuit board 7. The circuit board 7 comprises a printed circuit. The printed circuit extends inside the housing 2 parallel to the rear face 5 of the box 3.

The first portion of the meter 1 comprises electrical and optoelectronic components that are mounted on the first fraction 6 of the circuit board 7.

In this example, the electrical and optoelectronic components comprise a processor module, an RF communication module 9, a switch component, an internal antenna 11, an LED 12, a photodiode 13, and a first portion of an RF coupler 14.

The processor module includes a processor component. The processor component is adapted to execute instructions of a program in order to perform the tasks that are dedicated thereto. In this example, the processor component is a microcontroller 15, however it could be some other component, e.g. a processor or a field programmable gate array (FPGA).

The microcontroller 15 is arranged to control the RF communication module 9 and the switch component. The microcontroller 15 is also arranged both to provide a power supply to the LED 12 so that it emits a light signal, and also to acquire an electrical detection signal as produced by the photodiode 13.

The RF communication module 9 comprises a transmitter and a receiver. The transmitter transforms an outgoing data signal, as produced by the microcontroller 15, into an outgoing radio frequency signal adapted to be applied as input to the internal antenna 11 (and to the external antenna, as described below) in order to be transmitted by the internal antenna 11 (or by the external antenna). The receiver transforms an incoming radio frequency signal as received by the internal antenna 11 (or by the external antenna) and transforms it into an incoming data signal adapted to be received by the microcontroller 15.

The switch component is an RF switch 10 comprising an input E connected to the RF communication module 9, a first output S1 connected to the internal antenna 11, and a second output S2 connected to the first portion of the RF coupler 14.

In this example, the internal antenna 11 is printed on the printed circuit of the circuit board 7.

The RF coupler 14 comprises first and second portions that are electrically isolated from each other. The first portion of the RF coupler 14 is included in the first portion of the meter 1 and it is connected to the second output S2 of the RF switch 10, while the second portion of the RF coupler 14 is included in the second portion of the meter 1.

The LED 12 is arranged to emit light signals in the infrared range. It is advantageous to select a wavelength that is not situated in the spectrum that is visible to the human eye. Thus, the emitted light signals do not attract the attention of a user. In this example the LED 12 that is used emits light signals lying in the near infrared spectrum, i.e. presenting a wavelength lying typically in the range 850 nanometers (nm) to 1000 nm.

The LED 12 is also selected to be relatively directional, i.e. presenting an aperture angle that is as small as possible, typically less than ±30° (i.e. a total aperture angle of less than 60°). The LED 12 is also selected while taking account of its environmental conditions of use, and in particular as a function of the range of temperatures that might exist in the meter 1 at the location where the LED 12 is positioned. In this example, the LED 12 is a component of the "surface mount" type, with an orientation of 90°, i.e. the LED 12 has an emission zone that extends vertically relative to the printed circuit of the circuit board 7.

By way of example, the LED 12 that is selected has the reference SFH 4045N from the component manufacturer Osram.

The photodiode 13 is sensitive to the light signals emitted by the LED 12. When the photodiode 13 receives a light signal coming from a light signal emitted by the LED 12, the photodiode 13 produces an electrical detection signal that is representative of the received light signal.

By way of example, the photodiode 13 that is selected has the reference SFH 325 FA from the manufacturer Osram.

There follows a description of the second portion of the meter 1 that is electrically isolated from the first portion.

The second portion of the meter 1 occupies a second fraction 16 of the circuit board 7 that is electrically isolated from the first fraction 6 of the circuit board 7. The second fraction 16 presents an area that is rectangular and smaller than the area of the first fraction 6, and it extends into the first fraction 6 perpendicularly from an edge of the printed circuit.

The second portion of the meter 1 comprises both the second portion of the RF coupler 14, which is isolated from the first portion of the RF coupler 14, and also a first connector 20. The second portion of the RF coupler 14 and the first connector 20 are mounted on the second fraction 16 of the circuit board 7.

A cavity 21 is made in the lid 4 of the housing 2 of the meter 1. The entrance to the cavity 21 is situated in a bottom face 22 of the lid 4. The cavity 21 extends inside the lid 4 from the bottom face 22 of the lid 4, perpendicularly to the bottom face 22 of the lid 4.

The first connector 20 is positioned in the cavity 21.

A rear portion of the first connector 20 is connected to the second portion of the RF coupler 14. The first connector 20 is thus connected to a front-end component of the first portion of the meter 1, specifically the RF switch 10, via the RF coupler 14.

In this example, the first connector 20 is a subminiature version A (SMA) connector. The first connector 20 is selected to have the reference R125680000W from the manufacturer Radiall.

A reception space 25 that is defined in the cavity 21 extends facing the front portion of the first connector 20. The reception space 25 is arranged to receive a second connector that is complementary to the first connector 20.

In this example, specifically, the second connector is positioned at a first end of a cable that has an external antenna at its second end.

The second connector may be screwed onto the first connector 20 and it may be unscrewed therefrom, either by hand, or else using a tool such as an SMA connector torque wrench.

These screwing and unscrewing operations can be performed while the lid 4 is mounted on the box 3 of the housing 2, providing the terminal-cover is not present. These screwing and unscrewing operations are generally performed while installing the meter 1. Once the operations have been performed, the terminal-cover is put into place and then sealed to the lid 4.

A first duct 30 and a second duct 31 are defined inside the lid 4 of the housing 2 of the meter 1. The first and second ducts 30 and 31 form parts of the second portion of the meter 1.

The first and second ducts 30 and 31 both extend parallel to the bottom face 22 of the lid 4, and each of them has a first end opening out into the first portion of the meter 1, and a second end opening out into the reception space 25 of the cavity 21, in the proximity of the entrance to the cavity 21. The first and second ducts 30 and 31 lie on the same axis and they are positioned on either side of the cavity 21.

The first and second ducts 30 and 31 are tunnels defined in a single part forming the lid 4. In this example, the first and second ducts 30 and 31 are cylindrical with a disk-shaped section.

When the circuit board 7 is in position in the housing 2 and the lid 4 is mounted on the box 3, each of the first and second ducts 30 and 31 extends in part over the first portion 6 and in part over the second portion 16 of the circuit board 7.

The lid 4, and the first and second ducts 30 and 31 are made by molding and they come from a single mold. Specifically, the mold includes removable slides that are left within the mold when making a lid that does not need any ducts, and that are removed from the mold when making a lid that requires the ducts. This provides a non-negligible reduction in the cost of mass-producing the lids, since the same mold can be used for making two different types of lid.

The LED 12 is positioned at the first end of the first duct 30. The photodiode 13 is positioned at the first end of the second duct 31. The LED 12 and the photodiode 13 are thus positioned facing each other on either side of the reception space 25.

The first and second ducts 30 and 31 thus form waveguides for the light signals emitted by the LED 12 and for the light signals received by the photodiode 13 and resulting from the emitted light signals.

In this example, a respective converging lens 27 is situated inside each of the first and second ducts 30 and 31, in the proximity of the second end of each of the first and second ducts 30 and 31.

The converging lenses 27 serve to guide the light signals emitted by the LED 12 even more effectively towards the photodiode 13.

Any type of converging lens can be used: biconvex, plano-convex, etc.

A respective transparent plastics stopper 28 is positioned at the second end of each of the first and second ducts 30 and 31. The transparent plastics stoppers 28 serve to avoid dust penetrating into the meter 1 via the first duct 30 or via the second duct 31.

The LED 12 and the photodiode 13 are used as follows.

At regular intervals, the microcontroller 15 supplies power to the LED 12 (optionally via a driver circuit included in the processor module). The LED 12 then emits light signals.

When no external antenna is connected to the meter 1, the antenna that is to be used by the meter 1 for transmitting or receiving data is the internal antenna 11 of the first portion of the meter 1.

Since there is no second connector present in the reception space 25 facing the first connector 20, the emitted light signals travel along the first duct 30, across the reception space 25, and along the second duct 31, without encountering any obstacle. The photodiode 13 then receives the light signals. On the basis of the received light signals, the photodiode 13 produces an electrical detection signal that is representative of the received light signals.

Since the emitted light signals do not encounter any obstacle, the received light signals are of light intensity that is greater than or equal to a predetermined light intensity threshold, and thus the electrical detection signal presents a current or a voltage that is greater than or equal to a predetermined electrical threshold (defined on the basis of the predetermined light intensity threshold).

The microcontroller 15 acquires the electrical detection signal and thus detects that the second connector is absent from the reception space 25. The microcontroller 15 connects the input E of the RF switch 10 to the first output S1 of the RF switch 10 so that the RF communication module 9 is connected to the internal antenna 11 of the meter 1.

In contrast, when an external antenna is connected to the meter 1, the antenna that is to be used by the meter 1 for transmitting or receiving data is the external antenna. This external antenna is specifically designed to improve both the transmission of outgoing RF signals and also the reception of incoming RF signals.

A second connector is then connected to the first connector 20, and is thus positioned in the reception space 25.

The light signals emitted by the LED 12 travel along the first duct 30, but they are blocked by the second connector.

The photodiode 13 then receives light signals at very low light intensity, or indeed at zero intensity. The light intensity of the received light signals is thus less than the predetermined light intensity threshold, and thus the electrical detection signal presents a current or a voltage that is less than the predetermined electrical threshold.

The microcontroller 15 acquires the electrical detection signal and thus detects that the second connector is present in the reception space 25. The microcontroller 15 connects the input E of the RF switch 10 to the second output S2 of the RF switch 10 so that the RF communication module 9 is connected to the external antenna of the meter 1.

It is essential to avoid any false detection of an external antenna. Specifically, in the event of false detection, the microcontroller 15 would connect the input E of the RF switch 10, and thus the RF communication module 9, to the second output S2 of the RF switch 10, while it is not connected to an external antenna. The RF communication module 9 would then not be connected to any antenna, which would prevent the meter 1 from communicating by using RF communication.

The predetermined light intensity threshold is thus selected to be relatively low, and thus the predetermined electrical threshold is selected to be relatively low, in order to avoid any risk of false detection of an external antenna.

In order to make detection secure and avoid any false detection, a signature (i.e. a distinctive signal characteristic) is introduced into the emitted light signals, making it possible to distinguish light signals emitted by the LED 12 of the meter 1 from any interfering light signal that might be emitted by a source external to the meter 1 (intentionally or otherwise).

In this example, the distinctive characteristic consists in chopping the emitted light signals. The power supplied by the microcontroller 15 to the LED 12 is such that the LED emits light signals during a first predetermined duration and does not emit during a second predetermined duration, the first and second predetermined durations following one after the other and being repeated periodically. In this example, the first and second predetermined durations are both equal to 0.5 seconds (s), and the chopping is thus performed at a frequency of 1 hertz (Hz).

In order to optimize the electricity consumption of the meter 1, it should be observed that it is possible to perform such chopping only when the photodiode 13 has detected a light signal that is not chopped. Chopping then serves to confirm that the received light signal does indeed come from the LED 12.

It can be understood that the first and second ducts perform an isolation function between the first portion of the meter 1 and the outside. This also applies to the isolation distance D between the first connector 20 and the edges of the first fraction 6 of the circuit board 7.

Specifically, the first and second ducts 30 and 31 isolate the LED 12 and the photodiode 13 from the outside. Since the LED 12 and the photodiode 13 are situated in a zone that might potentially be subjected to voltages that are high and dangerous, the first and second ducts 30 and 31 should be of dimensions suitable for ensuring that this isolation complies with the recommendations set out in the applicable safety standards.

For use in Europe, an electricity meter must satisfy the requirements of European directives, and in particular the following standards:

EN 61010-1;
EN 62052-31;
EN 62368-1;
EN 50470-1.

As a function of the voltage surge category and of the degree of pollution under consideration, these standards define:

creepage distances;
air clearances;
dielectric withstand voltages.

The design of the meter 1, and thus the selection of the various components, of the materials used, and of the mechanical interfaces must enable the meter 1 to comply with these standards.

In this example, it is possible that voltages that are very high and thus dangerous might be present in the first portion of the meter 1. By way of example, these very high voltages may be 230 volts (V) coming from the electricity network to which the meter 1 is connected. Once the meter 1 has been installed, with the lid 4 in position on the box 3 and sealed, it must be ensured that an operator or a user in contact with the second connector, with the external antenna, or with any other surface of the housing 2 of the meter 1, and thus directly or indirectly with the second portion of the meter 1, remains isolated from high voltages, and thus from the first portion of the meter 1.

In order to determine the lengths of the first and second ducts 30 and 31, and also of the isolation distance D, use is made of the characteristics of the materials conventionally used for making the lid 4, the printed circuit of the circuit board 7 (e.g. FR4), and also the characteristics of air.

As a function of these characteristics and of the requirements for isolation, it has been determined that the lengths of the first and second ducts 30 and 31, and also the isolation distance D, should all be equal to a minimum of 8 millimeters (mm). This ensures an impulse voltage dielectric strength of 6 kilovolts (kV).

The lengths of each of the first and second ducts 30 and 31 are selected to be greater than 10 mm. Thus, each of the first and second ducts 30 and 31 extends over the first fraction 6 of the circuit board 7 over a length such that the LED 12 and the photodiode 13 can be positioned in the immediate proximity of, or indeed inside, the respective first ends of the first and second ducts 30 and 31.

In this example, the diameter of the first and second ducts 30 and 31 is equal to 3 mm, which corresponds to the diameter of the emission zone of the LED 12. The diameter of the first and second ducts 30 and 31 is less than the diameter of the cable connecting the second connector to the external antenna, so as to avoid any risk of confusion when installing the second connector.

When the terminal-cover is in place, it should also be observed that it is appropriate for the housing 2 of the meter 1 to provide an ingress protection (IP) rating that is sufficient to prevent dust and/or water from penetrating into the meter 1, in particular via the first connector 20, since otherwise the effectiveness of the isolation barrier can be degraded.

Naturally, the invention is not limited to the embodiment described, but covers any variant coming within the ambit of the invention as defined by the claims.

In the description above, a respective converging lens is used in each of the first and second ducts. It would naturally be possible to use only one lens, which would then preferably be positioned in the first duct, or indeed not to use any lens at all. It is also possible for the lens to be integral with the transparent plastics material, thereby forming a single part.

It is stated that the first and second ducts are cylindrical with a disk-shaped section. The shape of each duct could naturally be different from the shape described. In particular, each duct could be in the form of a cylinder having some other section, or indeed in the form of a partially hollow cylinder.

It is thus possible for one of the ducts (or each of them) to be in the form of a hollow channel section that is closed by the circuit board. Such a duct could thus cover the diode (or the photodiode) in part so that the top portion of the waveguide would then be formed by the duct and the bottom portion by the circuit board.

The first and second ducts could be separate parts fitted to the housing of the meter.

It is stated that the ducts are formed in the lid of the housing. The ducts could be formed in any other element of the housing, regardless of its position or its name: box, cover, top or bottom lid, terminal cover, etc.

All of the components mentioned (LED, photodiode, connector, etc.) could be different, and in particular could present references and electrical and optical characteristics other than those specified above.

The first and second portions of the meter need not necessarily be distinct fractions of a single circuit board. The first and second portions of the meter could each include respective district circuit boards.

The invention naturally applies to any type of electrical equipment, and by way of example it may be implemented in a set-top box, a mobile telephone, a tablet, a laptop computer, etc.

In the description, the invention is implemented in an electricity meter. The invention naturally applies to any type of meter, and in particular to water and gas meters.

The invention applies to any type of electrical equipment having a first portion and a second portion that is electrically isolated from the first portion, and to which a cable may be connected. The electrical equipment may optionally include an internal antenna, with the cable in question optionally being connected to an external antenna.

The way the electrical isolation is implemented may be determined by problems concerning the safety of people and equipment that arise because of the presence of high voltages or currents in the electrical equipment, as in this description. The implementation of the electrical isolation may be determined by other requirements, e.g. a requirement to protect computer data used or stored in the electrical equipment, which data must not be capable of being accessed or corrupted from outside the electrical equipment. The first connector must then also be isolated from any other connector internal to the equipment.

The invention claimed is:

1. Electrical equipment comprising a first portion and a second portion electrically isolated from the first portion, the first portion comprising a front-end component, a light-emitting diode (LED), a photodiode, and a processor module, the second portion comprising a first connector connected to the front-end component while being electrically isolated therefrom, a reception space extending facing the first connector and being arranged to receive a second connector suitable for connecting to the first connector, the light-emitting diode and the photodiode being arranged on either side of the reception space, the processor module being arranged to supply power to the LED so that it emits a light signal, to acquire an electrical detection signal that is produced by the photodiode and that is representative of a light signal received by the photodiode, and to detect the second connector being present in or absent from the reception space as a function of the electrical detection signal.

2. The electrical equipment according to claim 1, further comprising an internal antenna, an RF communication module, and a switch component situated in the first portion, the switch component having an input connected to the RF communication module, a first output connected to the internal antenna, and a second output connected to the first connector, the processor module being arranged to connect the input to the first output when the second connector is detected as being absent from the reception space, and to connect the input to the second output when the second connector is detected as being present in the reception space.

3. The electrical equipment according to claim 1, the electrical equipment being an electricity, water, or gas meter.

4. The electrical equipment according to claim 1, wherein the emitted light signal includes a signature enabling it to be distinguished from an interfering light signal that might be emitted by a source external to the electrical equipment.

5. The electrical equipment according to claim 4, wherein the signature consists in chopping the emitted light signal.

6. The electrical equipment according to claim 1, wherein the LED is positioned at a first end of a first duct, the photodiode is positioned at a first end of a second duct, the first and second ducts forming waveguides for the emitted light signal and for the received light signal, each of the first and second ducts forming part of the second portion and having a respective second end opening out into the reception space.

7. The electrical equipment according to claim 6, including at least one converging lens positioned at the second end of the first duct and/or at the second end of the second duct.

8. The electrical equipment according to claim 6, wherein the first and second ducts present lengths that are defined to provide a certain level of electrical isolation between the first and second portions.

9. The electrical equipment according to claim 6, wherein the first and second ducts are made in an element of a housing of the electrical equipment.

10. The electrical equipment according to claim 9, wherein the element of the housing, and the first and second ducts are made by molding and come from a single mold.

11. A system including electrical equipment comprising a first portion and a second portion electrically isolated from the first portion, the first portion comprising a front-end component, a light-emitting diode (LED), a photodiode, and a processor module, the second portion comprising a first connector connected to the front-end component while being electrically isolated therefrom, a reception space extending facing the first connector and being arranged to receive a second connector suitable for connecting to the first connector, the light-emitting diode and the photodiode being arranged on either side of the reception space, the processor module being arranged to supply power to the LED so that it emits a light signal, to acquire an electrical detection signal that is produced by the photodiode and that is representative of a light signal received by the photodiode, and to detect the second connector being present in or absent from the reception space as a function of the electrical detection signal, an external antenna, and a cable provided at a first end with the second connector connected to the first connector, and at a second end with the external antenna.

12. A configuration method performed in electrical equipment comprising a first portion and a second portion electrically isolated from the first portion, the first portion comprising a front-end component, a light-emitting diode (LED), a photodiode, and a processor module, the second portion comprising a first connector connected to the front-end component while being electrically isolated therefrom, a reception space extending facing the first connector and being arranged to receive a second connector suitable for connecting to the first connector, the light-emitting diode and the photodiode being arranged on either side of the reception space, the processor module being arranged to supply power to the LED so that it emits a light signal, to acquire an electrical detection signal that is produced by the photodiode and that is representative of a light signal received by the photodiode, and to detect the second connector being present in or absent from the reception space as a function of the electrical detection signal, and further comprising an internal antenna, an RF communication module, and a switch component situated in the first portion, the switch component having an input connected to the RF communication module, a first output connected to the internal antenna, and a second output connected to the first connector, the processor module being arranged to connect the input to the first output when the second connector is detected as being absent from the reception space, and to connect the input to the second output when the second connector is detected as being present in the reception space, the configuration method comprising the steps of:

emitting the light signal;
acquiring the electrical detection signal;
if the second connector is detected as being absent, connecting the input of the switch component to the first output of the switch component;
if the second connector is detected as being present, connecting the input of the switch component to the second output of the switch component.

13. A computer program comprising instructions for enabling a microcontroller of electrical equipment to perform a configuration method performed in electrical equipment comprising a first portion and a second portion electrically isolated from the first portion, the first portion comprising a front-end component, a light-emitting diode (LED), a photodiode, and a processor module, the second portion comprising a first connector connected to the front-end component while being electrically isolated therefrom, a reception space extending facing the first connector and being arranged to receive a second connector suitable for connecting to the first connector, the light-emitting diode and the photodiode being arranged on either side of the reception space, the processor module being arranged to supply power to the LED so that it emits a light signal, to acquire an electrical detection signal that is produced by the photodiode and that is representative of a light signal received by the photodiode, and to detect the second connector being present in or absent from the reception space as a function of the electrical detection signal, and further comprising an internal antenna, an RF communication module, and a switch component situated in the first portion, the switch component having an input connected to the RF communication module, a first output connected to the internal antenna, and a second output connected to the first connector, the processor module being arranged to connect the input to the first output when the second connector is detected as being absent from the reception space, and to connect the input to the second output when the second connector is detected as being present in the reception space, the configuration method comprising the steps of:

emitting the light signal;
acquiring the electrical detection signal;
if the second connector is detected as being absent, connecting the input of the switch component to the first output of the switch component;
if the second connector is detected as being present, connecting the input of the switch component to the second output of the switch component.

14. Storage means wherein they store a computer program comprising instructions for enabling a microcontroller of electrical equipment to perform a configuration method performed in electrical equipment comprising a first portion and a second portion electrically isolated from the first portion, the first portion comprising a front-end component, a light-emitting diode (LED), a photodiode, and a processor module, the second portion comprising a first connector connected to the front-end component while being electrically isolated therefrom, a reception space extending facing the first connector and being arranged to receive a second connector suitable for connecting to the first connector, the light-emitting diode and the photodiode being arranged on either side of the reception space, the processor module being arranged to supply power to the LED so that it emits a light signal, to acquire an electrical detection signal that is produced by the photodiode and that is representative of a light signal received by the photodiode, and to detect the second connector being present in or absent from the reception space as a function of the electrical detection signal, and further comprising an internal antenna, an RF communication module, and a switch component situated in the first portion, the switch component having an input connected to the RF communication module, a first output connected to the internal antenna, and a second output connected to the first connector, the processor module being arranged to connect the input to the first output when the second connector is detected as being absent from the reception space, and to connect the input to the second output when the second connector is detected as being present in the reception space, the configuration method comprising the steps of:

emitting the light signal;
acquiring the electrical detection signal;
if the second connector is detected as being absent, connecting the input of the switch component to the first output of the switch component;
if the second connector is detected as being present, connecting the input of the switch component to the second output of the switch component.

* * * * *